United States Patent [19]
Ono

[11] Patent Number: 5,500,786
[45] Date of Patent: Mar. 19, 1996

[54] INSULATING ELEMENT HAVING HEIGHT GREATER THAN HEIGHTS OF NEIGHBORING COMPONENTS

[75] Inventor: Tsuyoshi Ono, Kawasaki, Japan

[73] Assignee: Fujitsu Ltd., Kawasaki, Japan

[21] Appl. No.: 274,843

[22] Filed: Jul. 14, 1994

[30] Foreign Application Priority Data

Oct. 8, 1993 [JP] Japan ...................... 5-253341

[51] Int. Cl.⁶ ..................................... H05K 7/02
[52] U.S. Cl. .................... 361/760; 361/752; 361/807; 361/816; 174/35 R
[58] Field of Search ..................... 361/816, 760, 361/752, 762, 809, 802, 807, 818; 174/166 S, 35 R; 257/659; 439/108, 109

[56] References Cited

U.S. PATENT DOCUMENTS 3,652,899  3/1972  Henschen ................... 317/101 DH

FOREIGN PATENT DOCUMENTS

57-211714  12/1982  Japan.

Primary Examiner—Leo P. Picard
Assistant Examiner—Y. Whang
Attorney, Agent, or Firm—Staas & Halsey

[57] ABSTRACT

An insulating element includes an insertion portion extending from a first surface of a circuit board when the insulating element is inserted into a through hole formed in the circuit board. The insertion portion has a first height measured from the first surface. The first height is greater than heights of leads of components arranged at sides of the insulating element. A holding portion of the insulating element is connected to the insertion portion. The holding portion has a second height measured from a second surface of the circuit board, and has a second height greater than heights of the components arranged at the sides of the insulating element.

17 Claims, 8 Drawing Sheets

| POTENTIAL DIFFERENCE BETWEEN HIGH-VOLTAGE COMPONENT AND LOW-VOLTAGE COMPONENT (Vrms) | NECESSARY INSULATION SPACE DISTANCE (mm) | HEIGHT X (Y) (mm) |
|---|---|---|
| 50 | 4.0 | EQUAL TO OR GREATER THAN 2.0 |
| 150 | 4.0 | EQUAL TO OR GREATER THAN 2.0 |
| 300 | 4.0 | EQUAL TO OR GREATER THAN 2.0 |
| 600 | 6.0 | EQUAL TO OR GREATER THAN 3.0 |
| 1,000 | 6.4 | EQUAL TO OR GREATER THAN 3.2 |
| 2,000 | 8.4 | EQUAL TO OR GREATER THAN 4.2 |
| 5,000 | 17.5 | EQUAL TO OR GREATER THAN 8.8 |
| 7,000 | 25.0 | EQUAL TO OR GREATER THAN 12.5 |
| 10,000 | 37.0 | EQUAL TO OR GREATER THAN 18.5 |
| 20,000 | 80.0 | EQUAL TO OR GREATER THAN 4.0 |
| 30,000 | 130.0 | EQUAL TO OR GREATER THAN 6.5 |

INSULATING ELEMENT HAVING HEIGHT GREATER THAN HEIGHTS OF NEIGHBORING COMPONENTS

BACKGROUND OF THE INVENTION

1. Field of the Invention

The present invention generally relates to insulating elements, and more particularly to an electrically insulating element which is mounted on a circuit board and spatially isolates a high voltage element and a low voltage element on the circuit board. Further, the present invention is concerned with a circuit board using such an electrically insulating element.

Recently, it has been required that in the field of development and production of electric products, the structures of these electric products satisfy safety requirements according to various standards such as IEC (International Electrotechemical Commission), UL (Underwriters Laboratory Inc.), and CSA (Canadian Standards Association). One of the safety requirements is an isolation space distance, which depends on the potential difference between parts.

2. Description of the Prior Art

Figure 1A:
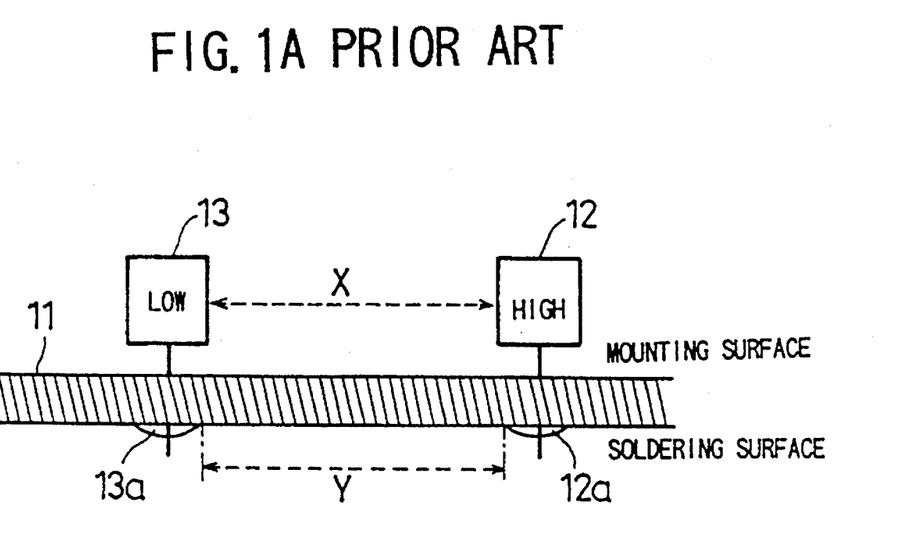
FIG. 1A is a diagram of a conventional arrangement of components mounted on a printed circuit board.

FIG. 1A is a diagram showing an arrangement of parts mounted on a printed circuit board. Conventionally, an electric product such as a CRT (Cathode Ray Tube) has a printed circuit board on which high-voltage parts and low-voltage parts are mounted. Referring to FIG. 1A, a high-voltage component 12 and a low-voltage component 13 are mounted on a mounting surface of a printed circuit board 11 by inserting leads of these circuit components into the printed circuit board 11. The leads of the components 12 and 13 are soldered on a soldering surface of the printed circuit board 11 so that solder lands 12a and 13a are formed on the soldering surface.

The aforementioned safety standards requires that the distances between the high-voltage component 12 and the low-voltage component 13 are as long as an appropriate insulation space distance defined by the safety standards. In the case shown in FIG. 1A, the distances between the components 12 and 13 includes a distance X and a distance Y. The distance X is the shortest distance between the components 12 and 13 on the mounting surface side, and the distance Y is the shorted end-to-end distance between the components 12 and 13 on the soldering surface side. The insulation space distance is the distance X or Y which is shorter than the other under a condition where there is no parts between the components of concern.

The appropriate insulation space distance is an insulation space distance depending on the potential difference between the components 12 and 13. For example, if the potential difference is equal to 100 V, the appropriate insulation space distance between the components 12 and 13 is equal to or longer than 4 mm. Hence, when the high-voltage component 12 and the low-voltage component 13 are mounted on the same printed circuit board 11, the components 12 and 13 are spaced away from each other by the appropriate insulation space distance defined by the safety standards.

Figure 1B:
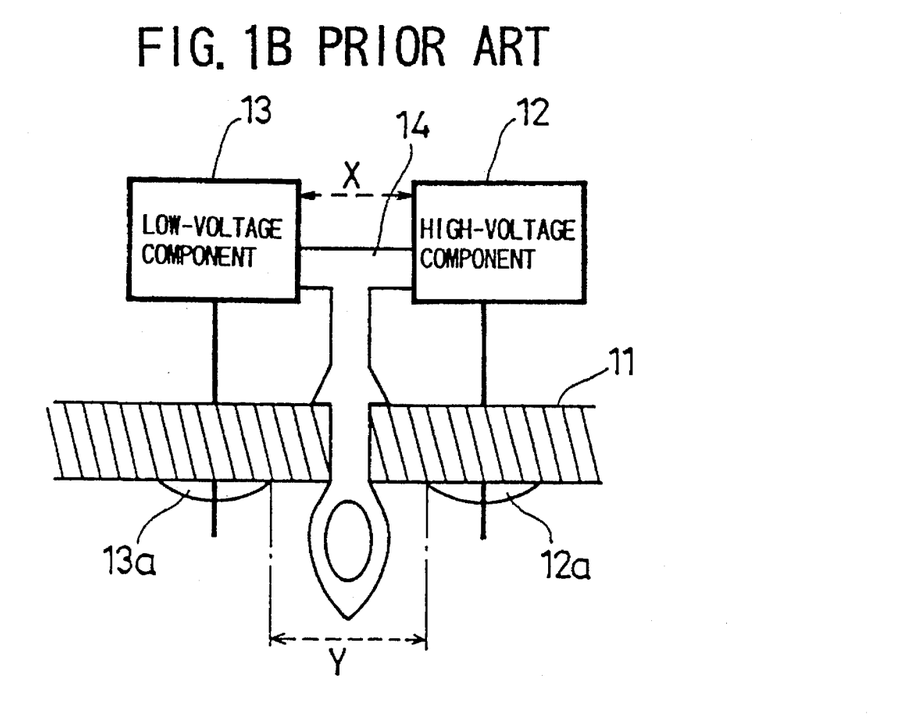
FIG. 1B is a diagram of another conventional arrangement of components mounted on a printed circuit board.

Japanese Laid-Open Patent Application No. 57-211714 discloses an insulation spacer designed taking into account the above insulation space distance. FIG. 1B shows a spacer 14 proposed by the above Japanese Application. The spacer 14 is interposed between the high-voltage component 12 and the low-voltage component 13 and is in contact with the facing sides of these components. The insulation spacer 14 has an approximately T-shaped cross section and is made of an electric insulation material. The insulating spacer 14 has a head portion, which ensures the distance X between the high-voltage component 12 and the low-voltage component 13. When the insulation space distance between the high-voltage component 12 and the low-voltage component 13 is X dependent on the potential difference therebetween, the insulation spacer 14 ensures the distance X and prevents a reduction in the distance X due to an inclination of the component 12 or 13 or both.

However, even in a case where the high-voltage component 12 and the low-voltage component 13 are disposed in areas close to each other on the mounting surface of the printed circuit board 11, these components must be spaced apart from each other by the appropriate insulation space distance depending on the potential difference between the components 12 and 13 irrespective of whether or not the insulation spacer 14 is used. Hence, it is very difficult to facilitate down-sizing of the printed circuit board 11 and thus the electric products using the board 11. Further, as the potential difference between the components 12 and 13 becomes greater, the insulation space distance becomes longer. This also prevents down-sizing of the printed circuit board 11.

SUMMARY OF THE INVENTION

It is a general object of the present invention to provide an insulating element in which the above disadvantages are eliminated.

A more specific object of the present invention is to provide an insulating element contributing to down-sizing of circuit boards.

The above objects of the present invention are achieved by an insulating element comprising:

an insertion portion extending from a first surface of a circuit board when the insulating element is inserted into a through hole formed in the circuit board, the insertion portion having a first height measured from the first surface, the first height being greater than heights of leads of components arranged at sides of the insulating element; and a holding portion connected to the insertion portion, the holding portion having a second height measured from a second surface of the circuit board, the second height being greater than heights of the components arranged at the sides of the insulating element.

The above objects of the present invention are also achieved by an insulating element comprising:

an insertion portion extending from a first surface of a circuit board when the insulating element is inserted into a through hole formed in the circuit board; and a holding portion connected to the insertion portion, the holding portion having a height measured from a second surface of the circuit board on which components are mounted, the height being greater than heights of the components arranged at sides of the insulating element.

Another object of the present invention is to provide a printed circuit board having the above-mentioned insulating element.

This object of the present invention is achieved by a circuit board comprising:

a board on which wiring patterns are printed, the board having a through hole;

circuit components mounted on the board; and an insulating member inserted into the through hole so that components to which different voltages are separated by the insulating member, the insulating member comprising:

an insertion portion extending from a first surface of the board and having a first height measured from the first surface, the first height being greater than heights of leads of the components arranged at sides of the insulating element; and a holding portion connected to the insertion portion, the holding portion having a second height measured from a second surface of the circuit board, the second height being greater than heights of the components arranged at the sides of the insulating element.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 2A:
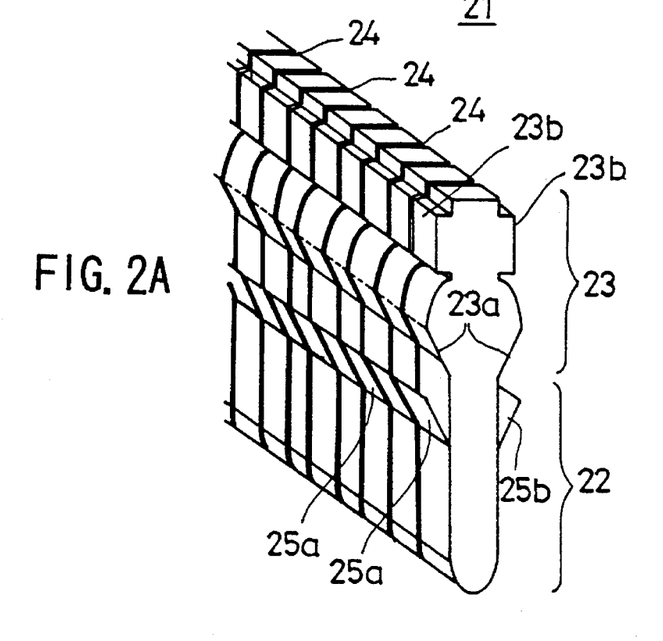
FIG. 2A is a perspective view of an insulating element according to a first embodiment of the present invention.
Figure 2B:
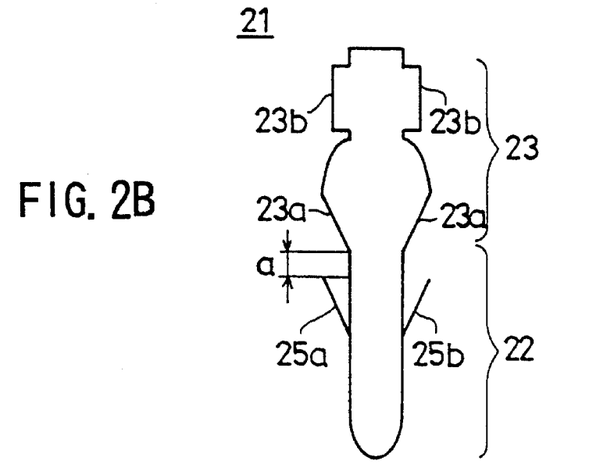
FIG. 2B is a cross-sectional view of the insulating element shown in FIG. 2A.
Figure 2C:
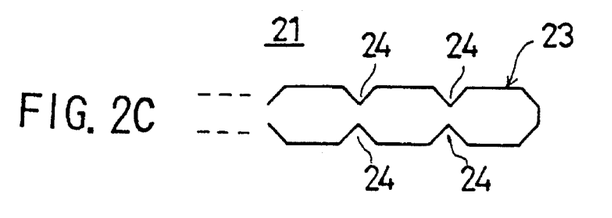
FIG. 2C is a plan view of the insulating element shown in FIG. 2A.

FIGS. 2A, 2B and 2C show an insulating element 21 according to a first embodiment of the present invention. More particularly, FIG. 2A is a perspective view of the insulating element 21, FIG. 2B is a cross-sectional view of the insulating element 21, and FIG. 2C is a plan view of the insulating element 21.

The insulating element 21 has an insertion portion 22 and a holding portion 23, these portions being integrally formed by an insulating member of a plate shape. It is preferable that the insulating member used in the present invention is a member which has insulation performance, incombustibility and flexibility, and is, for example, nylon. It is possible to use an insulating material either incombustibility or flexibility. The insertion portion 22 has an end portion which becomes narrower toward the tip end thereof. The holding portion 23 has a tapered portion 23a, which is connected to the boundary of the insertion portion 22. The cross-section of the tapered portion 23a becomes wider as the distance from the above boundary becomes longer. Further, the holding portion 23 has a projection 23b, which has a shape facilitating gripping of the holding portion 23 and slightly projects forward and backward.

A plurality of grooves 24 are formed around the body of the insulating element 21 and are arranged at predetermined constant intervals in the longitudinal direction of the insulating element 21. The grooves 24 are used to divide the insulating element 21 into parts or used to flexibly bend the insulating element 21 so as to match the shape of a hole formed on a circuit board such as a printed circuit board.

The insulating member has engagement parts 25a and 25b, which extend upward from the front and back surfaces of the insertion part 22 and are separated from each other in the longitudinal direction by the grooves 24. The engagement parts 25a and 25b are integrally formed parts of the insertion portions 22 and lower ends pivotably connected to the front and back surfaces of the insertion part 22. As shown in FIG. 2B, the distance "a" between the boundary of the insertion portion 22 and the holding portion 23 and the top ends of the engagement parts 25a and 25b is slightly less than the thickness of a circuit board (31), which will be described later.

Figure 3:
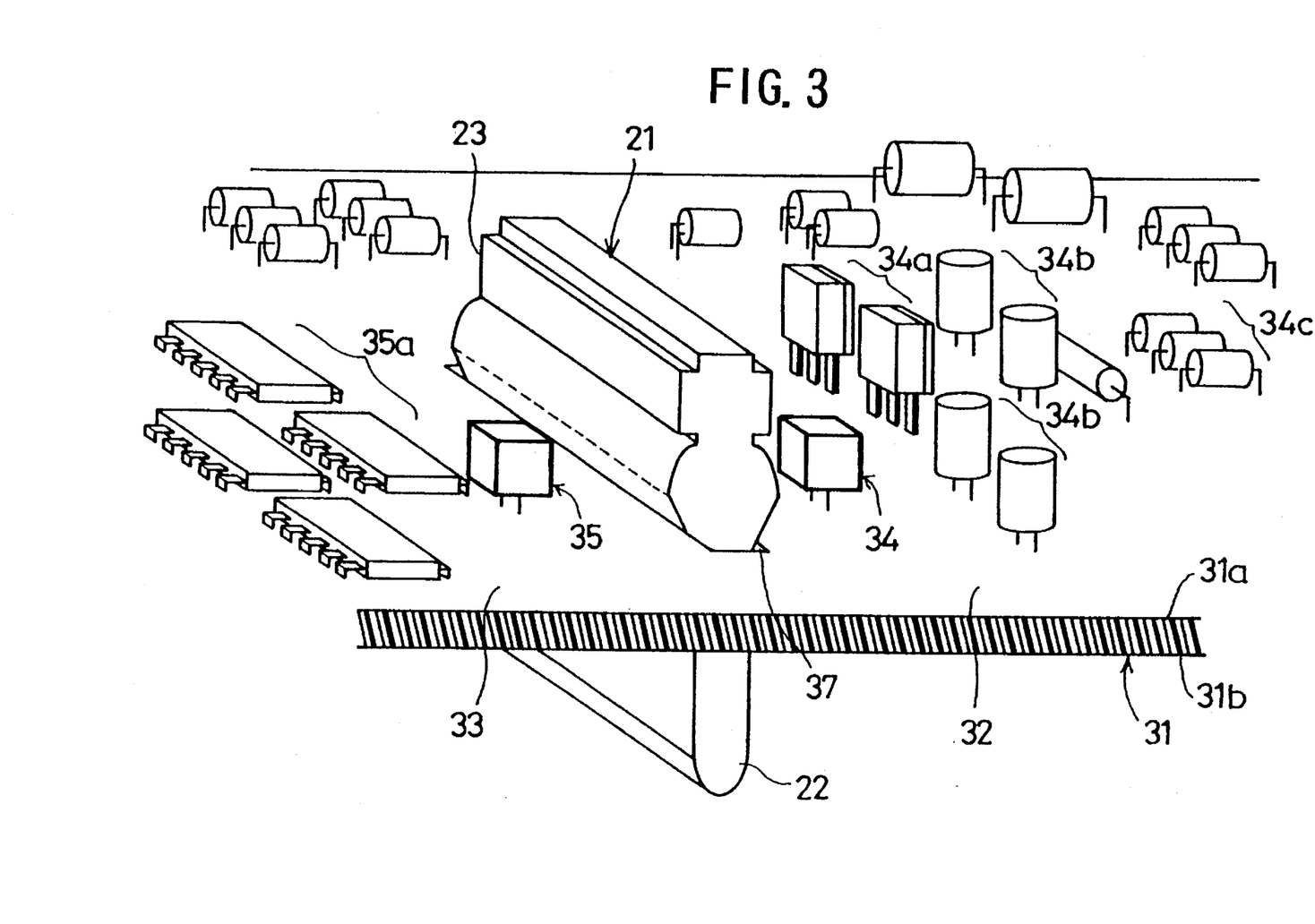
FIG. 3 is a perspective view of a printed circuit board to which the insulating element according to the first embodiment of the present invention is applied.
Figure 4:
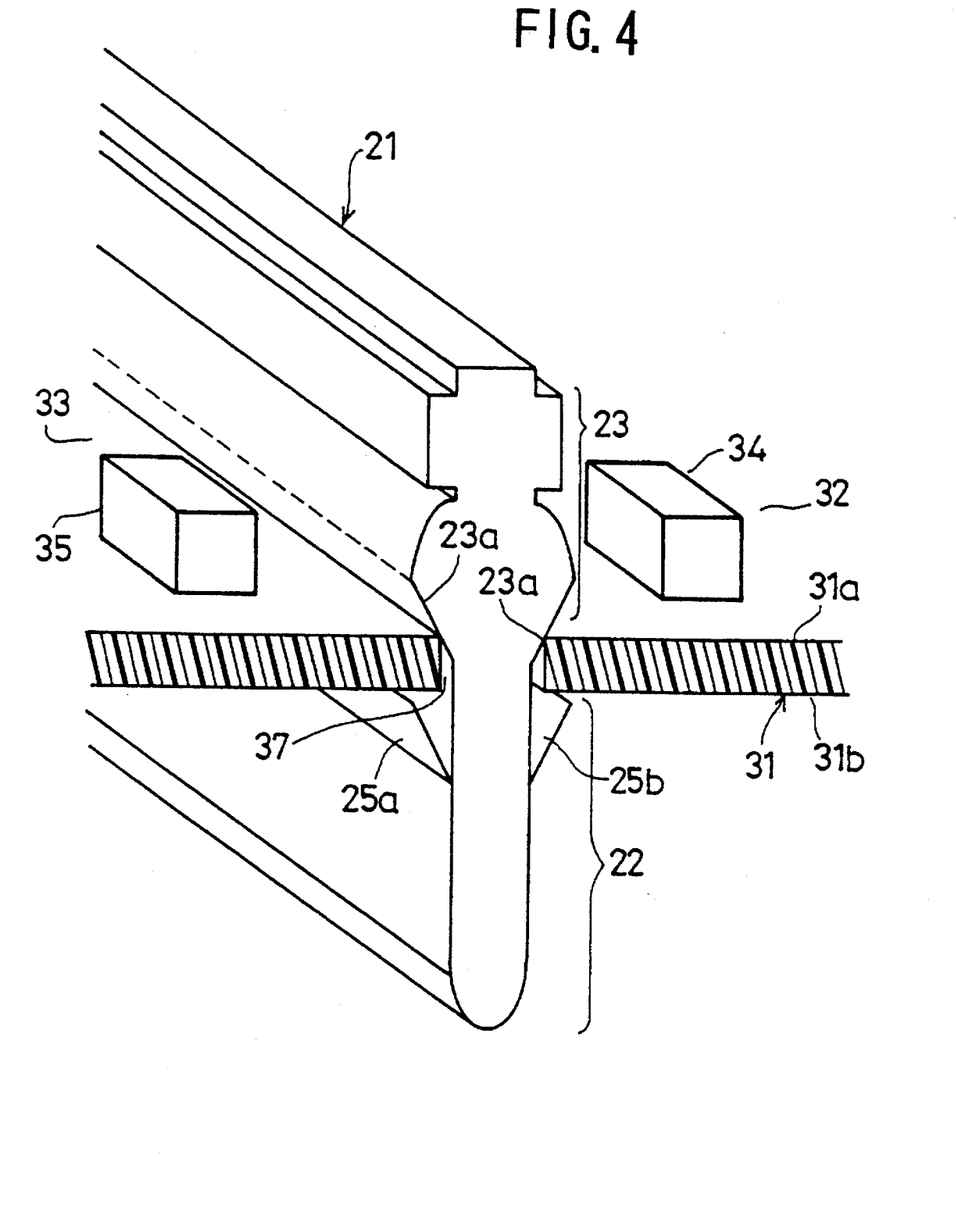
FIG. 4 is an enlarged perspective view of the insulating element mounted on the printed circuit board shown in FIG. 3.

FIG. 3 is a perspective view of a printed circuit board 31 into which the insulating element 21 shown in FIGS. 2A, 2B and 2C is inserted. FIG. 4 is an enlarged perspective view of the insulating element 21 inserted into the printed circuit board 31.

As shown in FIG. 3, a high-voltage area 32 and a low-voltage area 33 are defined on the printed circuit board 31, which is, for example, provided in an electric product such as a CRT. In the high-voltage area 32, there are mounted high-voltage components 34 such as a predetermined number of power transistors 34a, capacitors 34b and resistors 34c. In the low-voltage area 33, there are mounted low-voltage components 35 such as a predetermined number of IC (Integrated Circuit) chips 35a. The components used in the first embodiment of the present invention are of a lead insertion type. Lead holds (not shown) corresponding to the leads of the components are formed in the printed circuit board 31 and are soldered.

A through hole 37 having a rectangular shape is formed in an intermediate portion on the printed circuit board 31 between the high-voltage area 32 and the low-voltage area 33. The insulating element 21 is inserted into the rectangular hole 37. The insulating element 21 shown in FIGS. 2A through 2C are cut one of the grooves 24 so as to match the length of the rectangular hole 37, and the cut insulating element 21 is inserted into the rectangular hole 37. The holding portion 23 is located on a parts surface (mounting surface) 31a of the printed circuit board 31, and the insertion portion 22 is located on a soldering surface 31b of the printed circuit board 31. If the hole 37 has a curved shape, the insulating element 21 is bent at the grooves 24 so as to have the same curved shape as that of the hole 37.

More particularly, as shown in FIG. 4, when the insulating element 21 is inserted into the hole 37 of the printed circuit board 31 from the parts surface 31a thereof, the engagement parts 25a and 25b are closed to come into contact wit the front and back surfaces of the insertion portion 22. When the insulating element 21 is completely inserted into the hole 37, the engagement parts 25a and 25b are opened and come into contact with the printed circuit board 31 in the vicinity of the hole 37. In this manner, the insulating element 21 is fixed to the printed circuit board 31. The tapered portion 23a functions to securely fix the insulating element 21 to the printed circuit board 31.

The distance between the high-voltage area 32 and the low-voltage area 33 defined on the printed circuit board 31 is determined by the height of the insulating element 21 (the height of the insertion portion 22 and the height of the holding portion 23) used for the printed circuit board 31. In this case, the insulating element 21 is designed so that at least the insertion portion 22 is located so as to be higher than the tip ends of the leads of the high-voltage component 34 and the low-voltage component 35, and at least the holding portion 23 is higher than the top portions of these components.

Figure 5:
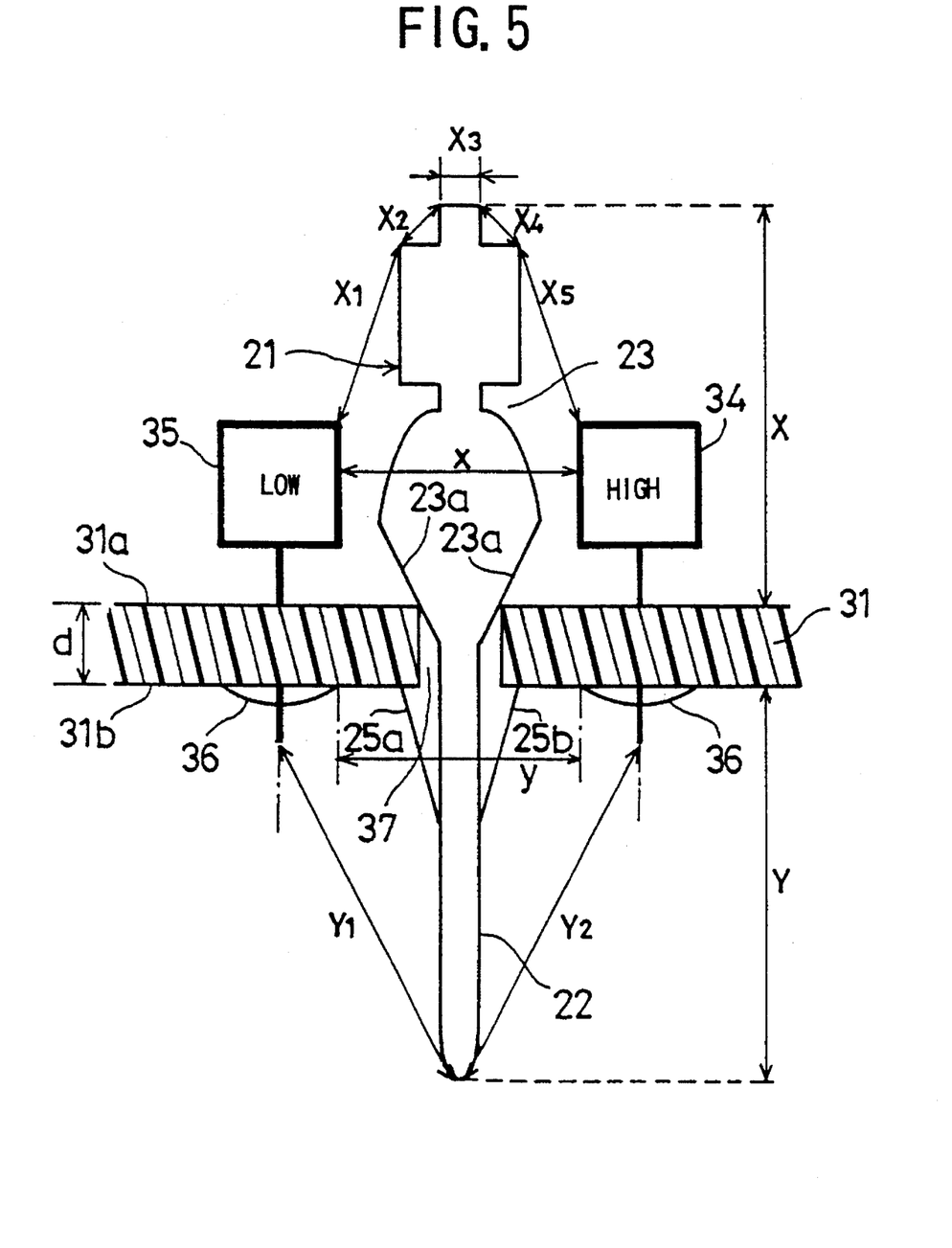
FIG. 5 is a cross-sectional view showing the function of the insulating element according to the first embodiment of the present invention.

FIG. 5 is a diagram showing the function of the insulating element 21. As shown in FIG. 5, the high-voltage component 34 and the low-voltage component 35 are mounted on the printed circuit board 31. It will now be assumed that the distance x between the facing sides of the components 34 and 35 on the parts surface of the printed circuit board 31 is defined and the distance y between facing ends of soldering lands 36 on the soldering surface of the printed circuit board 31 is defined. The distance y is the shortest distance between the components 34 and 35.

Further, it will assumed that X denotes the height of the insulating element 21 inserted into the hole 37 from the parts surface 31a, and Y denotes the height of the insulating element 21 inserted into the hole 37 from the soldering surface 31b. The height of the insulating element 21 is equal to X+Y+d in total where d is the thickness of the printed circuit board 31.

Hence, the space distance between the high-voltage component 34 and the low-voltage component 35 is equal to $(X_1+X_2+X_3+X_4+X_5)$ on the parts surface 31a and is equal to $(Y_1+Y_2)$ on the soldering surface 31b. It will be noted that the space distances on the parts surface 31a and the soldering surfaces are respectively x and y if the insulating element 21 is not provided. Hence, the insulating element 21 functions to lengthen both the space distances on the parts surface 31a and the soldering surface 31b.

According to the first embodiment of the present invention, the space distance (insulation space distance) between the high-voltage component 34 and the low-voltage component 35 defined by the safety regulations of the standards depends on the height of the insulating element 21 based on the potential difference between the components 34 and 35 (in the case where the surface shape of the insulating element 21 does not affect the space distance).

Figure 6:
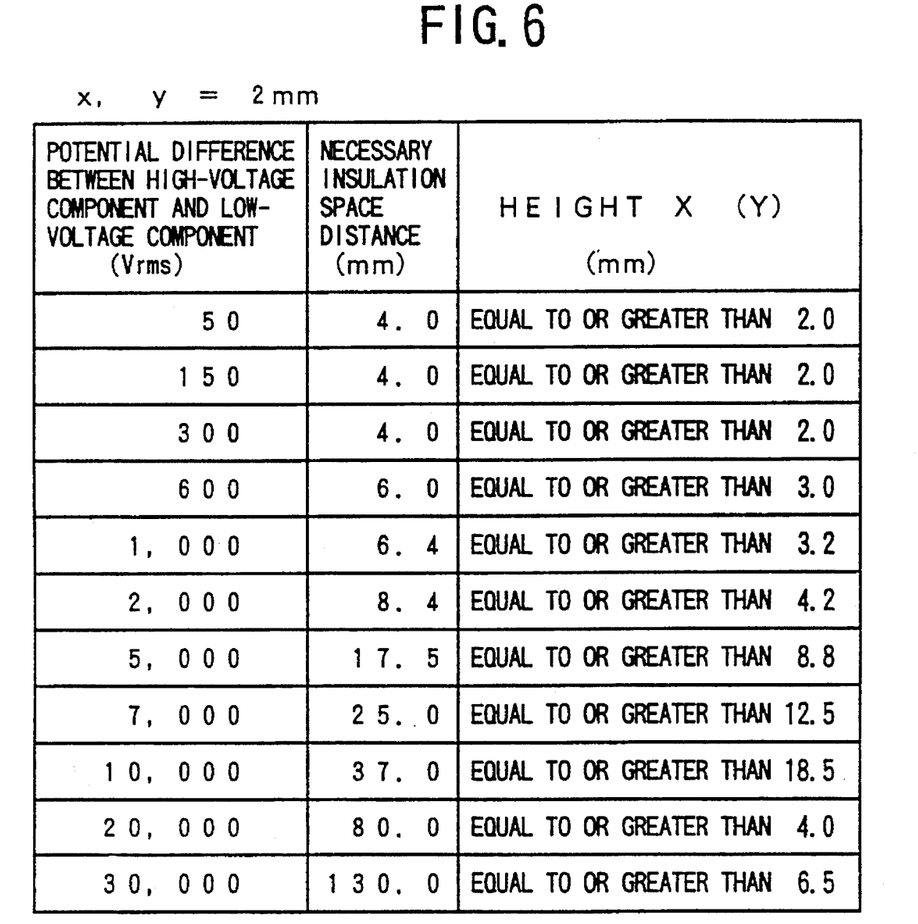
FIG. 6 shows the relationship among the height of the insulating element, the potential difference between a high-voltage component and a low-voltage component, and the insulation space distance therebetween.

FIG. 6 shows the relationship among the height of the insulating element 21, the potential difference between the high-voltage component 34 and the low-voltage component 35, and the insulation space distance. The insulation space distance needed on the basis of the potential difference between the components 34 and 35 actually spaced apart from each other by a distance x of 2 mm (the distance y is also 2 mm) can be obtained by the height X of the insulating element 21 from the parts surface 31a and the height Y of the insulating element 21 from the soldering surface 31b.

Turning now to FIG. 5 again, when the potential difference between the high-voltage component 34 and the low-voltage component 35 spaced apart from each other by a distance x of 2 mm is 150 [Vrms], the necessary insulation space distance is equal to or greater than 4.00 mm. When the height X (Y) of the insulating element 21 is 2.0 mm, $(X_1+X_2+X_3+X_4+X_5)$ is equal to 4 mm, and $(Y_1+Y_2)$ is equal to 4 mm.

As described above, even when the high-voltage component 34 and the low-voltage component 35 are arranged close to each other, it is possible to ensure the necessary insulation space distance required by the safety standards by interposing the insulating element 21 between the components 34 and 35. That is, the insulating element 21 functions to substantially increase the space distance. It will be noted that use of the insulating element 21 contributes to downsizing of the printed circuit board 31 and thus the electric products.

In the above-mentioned first embodiment of the present invention, the components are of the lead insertion type. However, the insulating element 21 can be used for components of a surface mounting type in which leads are soldered on the parts surface of the printed circuit board.

Figure 7:
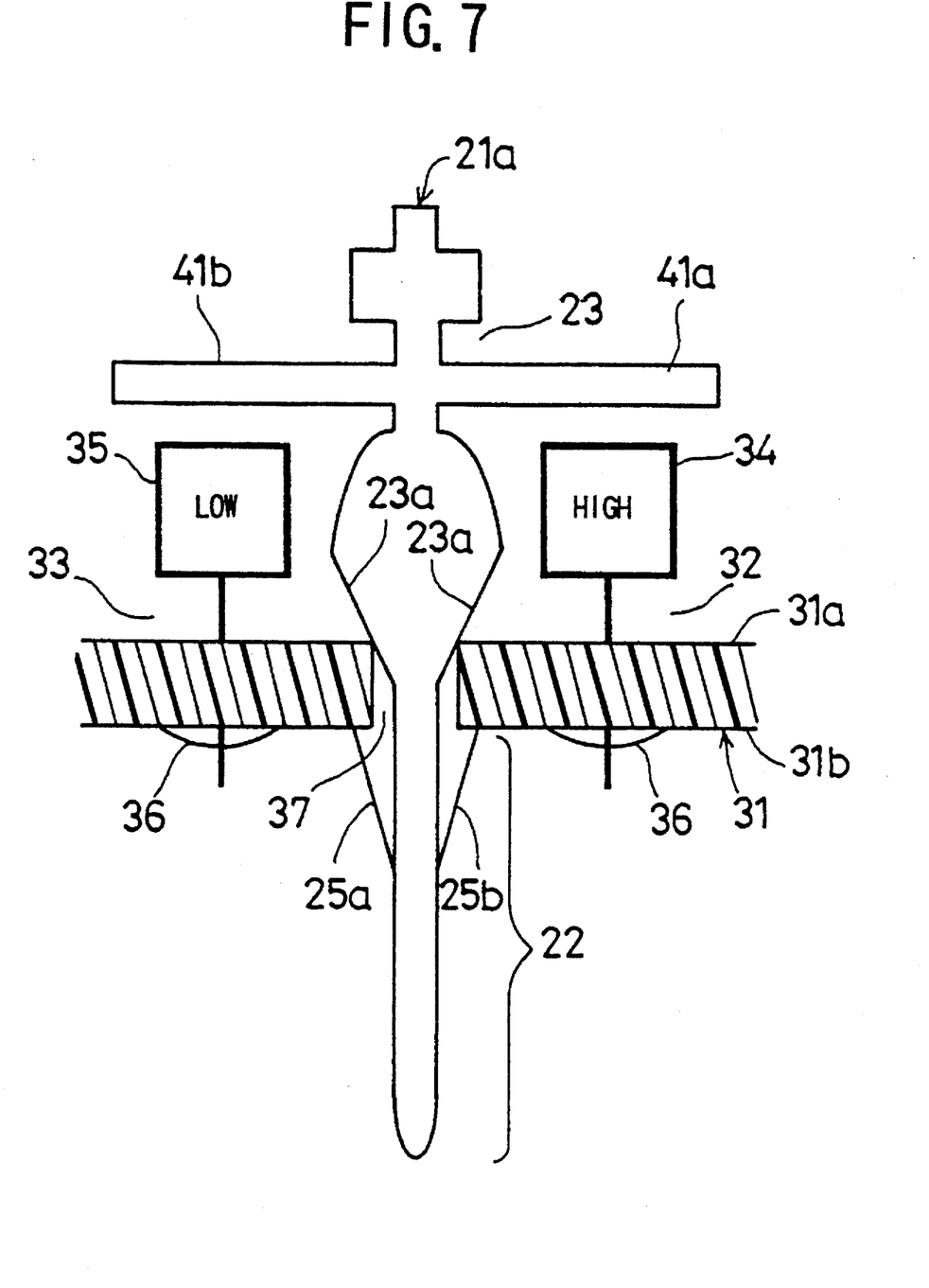
FIG. 7 is a cross-sectional view of an insulating element according to a second embodiment of the present invention.

FIG. 7 is a cross-sectional view of a second embodiment of the present invention. In FIG. 7, parts that are the same as those shown in the previously described figures are given the same reference numbers, and a description thereof will be omitted. An insulating element 21a according to the second embodiment of the present invention has extensions 41a and 41b horizontally extending from the front and back surfaces of the holding portion 23. The extensions 41a and 41b have predetermined lengths (which may be equal to or different from each other), and are integrally formed with the other parts of the insulating element 21a.

The extensions 41a and 41b extend above the high-voltage area 32 and the low-voltage area 33, and the space distance between the high-voltage component 32 and the low-voltage area 33 is lengthened by the lengths of the extensions 41a and 41b. Even if the components 34 and 35 are arranged too close to each other, it is possible to ensure the insulation space distance by using the insulating element 21a. It is necessary to ensure the insulation space distance on the soldering surface 31b by the length of the insertion portion 22 of the insulating element 21a. Hence, the insulating element 21a is effective particularly to components of the surface mounting type. In this case, it is possible to reduce the length of the insertion portion 22.

Figure 8:
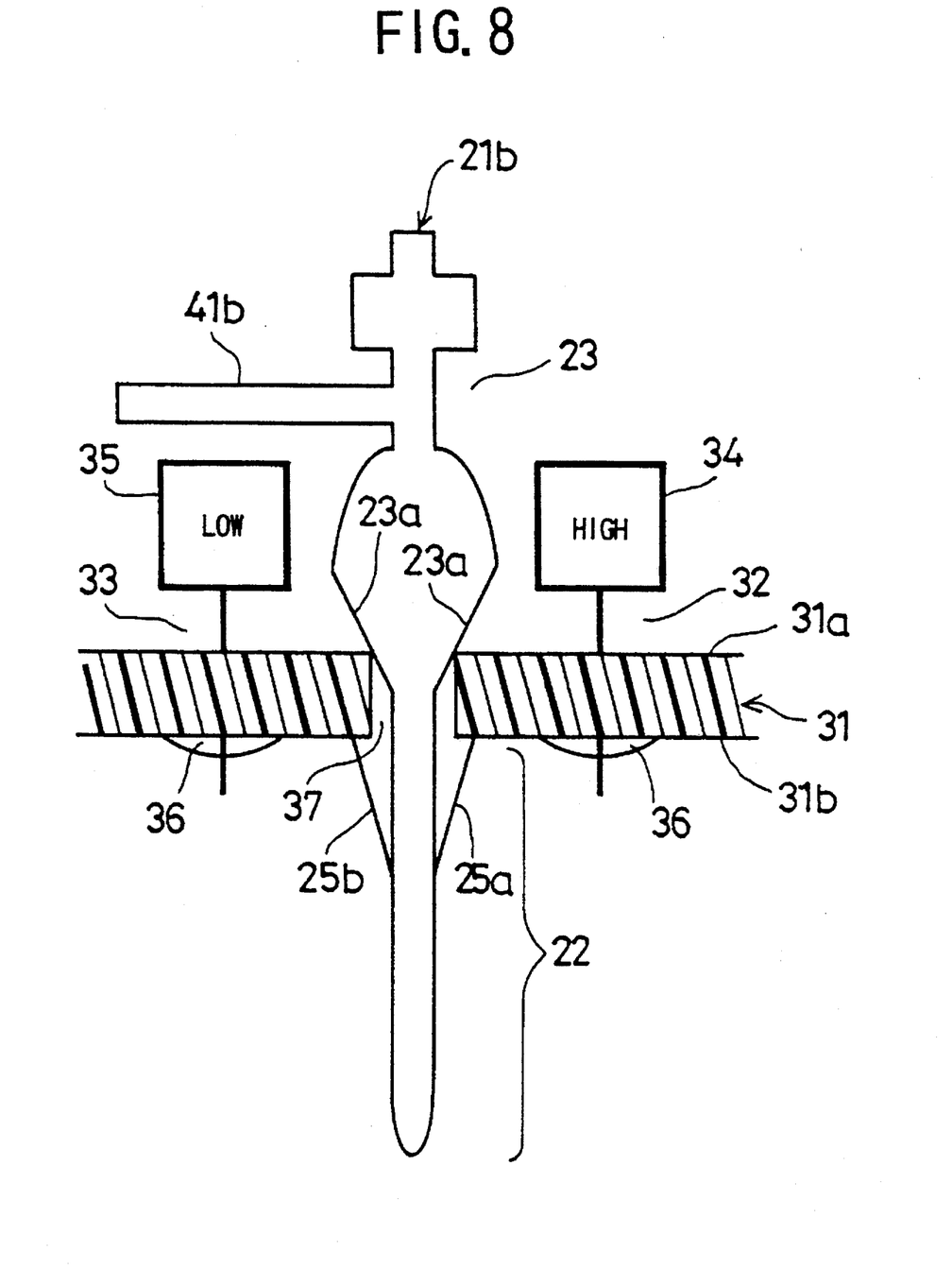
FIG. 8 is a cross-sectional view of an insulating element according to a third embodiment of the present invention.

FIG. 8 is a cross-sectional view of an insulating element 21b according to a third embodiment of the present invention. In FIG. 8, parts that are the same as those shown in the previously described figures are given the same reference numbers. The insulating element 21b has only the extension 41b, which extends above the low-voltage area 33 on the printed circuit board 33. The extension 41b is integrally formed with the other parts of the insulating element 21b. The extension 41b functions to lengthen the space distance between the high-voltage component 34 and the low-voltage component 35. The insulating element 21b is effective to the surface mounting type components, and particularly to a case where the high-voltage component 34 radiates a large amount of heat.

The present invention is not limited to the specifically disclosed embodiments, and variations and modifications may be made without departing from the scope of the present invention.

What is claimed is:

1. An insulating element comprising:

an insertion portion extending form a first surface of a circuit board when the insulating element is inserted into a through hole formed in the circuit board, the insertion portion having a first height measured from the first surface, said first height being greater than heights of leads of components arranged at side portions of the insulating element; and a holding portion connected to the insertion portion, said holding portion having a second height measured from a second surface of the circuit board, said second height being greater than heights of the components arranged at the side portions of the insulating element.

2. The insulating element as claimed in claim 1, wherein said insertion portion and said holding portion are made by an insulating member having at least one of incombustibility and flexibility.

3. The insulating element as claimed in claim 1, further comprising engagement parts which come into contact with the circuit board in the vicinity of said through hole and hold the insulating element on the circuit board.

4. The insulating element as claimed in claim 3, wherein said engagement parts are pivotably supported by said insertion portion.

5. The insulating element as claimed in claim 1, further comprising a plurality of grooves arranged at predetermined intervals in a predetermined direction on the insulating element.

6. The insulating element as claimed in claim 1, further comprising:

engagement parts which come into contact with the circuit board in the vicinity of said through hole and hold the insulating element on the circuit board; and a plurality of grooves arranged at predetermined intervals in a predetermined direction on the insulating element, said engagement parts being separated from each other at positions of the plurality of grooves.

7. The insulating element as claimed in claim 1, wherein said holding portion has a tapered part wider than the through hole of the circuit board.

8. The insulating element as claimed in claim 1, further comprising extensions extending above the components.

9. The insulating element as claimed in claim 1, further comprising an extension extending above some of the components arranged at the side portions of the insulating element.

10. The insulating element as claimed in claim 1, further comprising an extension extending above some of the components applied to a voltage lower than a voltage applied to other of the components.

11. An insulating element comprising:

an insertion portion extending from a first surface of a circuit board when the insulating element is inserted into a through hole formed in the circuit board; and a holding portion connected to the insertion portion, said holding portion having a height measured from a second surface of the circuit board on which components are mounted, said height being greater than heights of the components arranged at side portions of the insulating element.

12. The insulating element as claimed in claim 11, further comprising extensions extending above the components.

13. The insulating element as claimed in claim 11, further comprising an extension extending above some of the components.

14. A circuit board comprising:

a board on which wiring patterns are printed, said board having a through hole;

circuit components mounted on the board; and an insulating member inserted into said through hole so that said circuit components of different voltages are separated by said insulating member, said insulating member comprising:

an insertion portion extending form a first surface of the board and having a first height measured from the first surface, said first height being greater than heights of leads of the circuit components arranged at side portions of the insulating element; and a holding portion connected to the insertion portion, said holding portion having a second height measured from a second surface of the board, said second height being greater than heights of the circuit components arranged at the side portions of the insulating element.

15. The circuit board as claimed in claim 11, wherein the insertion portion has a height measured from the first surface, said height of the insertion portion being greater than heights of leads of the components arranged at the side portions of the insulating element.

16. The circuit board as claimed in claim 14, wherein said insulating element further comprises extensions extending above the circuit components arranged at the side portions of the insulating element.

17. The circuit board as claimed in claim 14, wherein said insulating element further comprises an extension extending above some of the components arranged at the side portions of the insulating element.

* * * * *